(12) United States Patent
Lim et al.

(10) Patent No.: US 7,470,579 B2
(45) Date of Patent: Dec. 30, 2008

(54) METHOD OF MANUFACTURING A THIN FILM TRANSISTOR

(75) Inventors: Hyuk Lim, Seoul (KR); Takashi Noguchi, Yongin-si (KR); Jong-man Kim, Suwon-si (KR); Kyung-bae Park, Seoul (KR); Huaxiang Yin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 35 days.

(21) Appl. No.: 11/557,360

(22) Filed: Nov. 7, 2006

(65) Prior Publication Data

US 2007/0108483 A1 May 17, 2007

(30) Foreign Application Priority Data

Nov. 14, 2005 (KR) ............... 10-2005-0108524

(51) Int. Cl.
*H01L 21/336* (2006.01)
(52) U.S. Cl. ..................................... 438/197
(58) Field of Classification Search ............... 438/149; 257/E51.005, E29.117, E29.137
See application file for complete search history.

(56) References Cited

U.S. PATENT DOCUMENTS

| | | | | |
|---|---|---|---|---|
| 2004/0051180 A1* | 3/2004 | Kado et al. | ............... | 257/774 |
| 2004/0077134 A1* | 4/2004 | Takayama et al. | ............ | 438/151 |
| 2005/0009249 A1* | 1/2005 | Oh et al. | ............... | 438/149 |
| 2005/0231657 A1* | 10/2005 | Zhang et al. | ............... | 349/42 |
| 2005/0236622 A1* | 10/2005 | Jung et al. | ............... | 257/66 |
| 2005/0255621 A1* | 11/2005 | Hotta et al. | ............... | 438/28 |
| 2006/0030085 A1* | 2/2006 | Park et al. | ............... | 438/149 |
| 2006/0057786 A1* | 3/2006 | Yamazaki | ............... | 438/149 |
| 2007/0007524 A1* | 1/2007 | You et al. | ............... | 257/59 |
| 2007/0051993 A1* | 3/2007 | Ho et al. | ............... | 257/296 |

OTHER PUBLICATIONS

"OI-ELA Poly-Si TFTs for Eliminating Residual Source/ Drain Junction Defects", Authors: Woo-Jin Nam, et al.; Electrochemical and Solid-State Letters, 8 (2) G41-G43 (2005).
"Anomalous Leakage Current in LPCVD Polysilicon MOSFET's"; Authors: Jerry G. Fossum, et al.; IEEE Transactions on Electron Devices, vol. ED-32, No. 9 (1985).
"Comparison of Different Techniques for Passivation of Small-Grain Polycrystalline-Si MOSFET's", M. Rodder, et al.; IEEE Electron Device Letters, vol. EDL-6, No. 11 (1985).

\* cited by examiner

*Primary Examiner*—Thao P. Le
(74) *Attorney, Agent, or Firm*—Cantor Colburn LLP

(57) ABSTRACT

A thin film transistor having an offset or a lightly doped drain (LDD) structure by self alignment and a method of fabricating the same comprises a substrate, a silicon layer disposed on the substrate and including a channel region, a source region and a drain region at both sides of the channel region, and offset regions, each offset regions disposed between the channel region and one of the source and drain regions at both sides of the channel region, a gate insulating layer covering the channel region and the offset regions disposed at both sides of the channel region excluding the source and drain regions, and a gate layer formed on the channel region excluding the offset regions. The thin film transistor has the structure in which an offset or LDD is obtained without an additional mask process.

7 Claims, 6 Drawing Sheets

METHOD OF MANUFACTURING A THIN FILM TRANSISTOR

This application claims priority to Korean Patent Application No. 10-2005-0108524, filed on Nov. 14, 2005, and all the benefits accruing therefrom under 35 U.S.C. § 119, the contents of which in its entirety are herein incorporated by reference.

BACKGROUND OF THE INVENTION

1. Field of the Invention

The present invention relates to a thin film transistor ("TFT") and a method of fabricating the same, and more particularly, to a thin film transistor ("TFT") in which a leakage current can be effectively reduced and a method of fabricating the same.

2. Description of the Related Art

Polycrystalline silicon ("p-Si") has higher electron mobility than that of amorphous silicon ("a-Si"), and thus is very useful for use in a switching device for display and memory devices.

It is well known that, in a p-Si transistor, leakage or loss of current occurs due to grain boundary traps in a depletion region of a drain of the p-Si transistor. Hydrogenation, in which the grain boundary traps are reduced by impurity implantation, still allows the grain boundary traps to remain. If a gate voltage and a drain voltage increase by the residual boundary traps, a leakage current still increases.

An offset structure has been proposed to more effectively reduce a leakage current. An offset region is a lightly doped drain ("LDD") and is located between a channel and a gate or a drain, respectively. The LDD deteriorates an electric field of the drain and reduces field emission caused by a gate voltage and a drain voltage. However, in the prior art, a local differential doping process using a mask is required to form an offset structure. In order to successfully perform differential doping in the offset region using the mask, the mask should be precisely aligned on a substrate. However, since the method uses a separate mask, a doping process is complicated and the method cannot be used in a substrate that is not resistant to heat, for example, a plastic substrate, etc.

Woo-Jin Nam et al., Electrochemical and Solid-State Letters, 8 (2) G41-G43 (2005), suggests elimination of residual ion doping damage from a drain junction by oblique-incidence excimer laser annealing ("OI-ELA"). In order to eliminate the residual ion doping damage in OI-ELA, a scanning laser beam near the drain junction disposed below a gate is directed to be incident on a substrate along an inclined optical axis. Thus, damage to the drain junction can be eliminated. However, since the scanning laser beam is incident to be inclined on the substrate, energy of the laser beam is nonuniformly distributed on the surface of silicon. The nonuniform energy distribution causes nonuniform heat treatment of a source and drain. Therefore, study of the nonuniform energy distribution and a method of solving the problem are desired.

BRIEF SUMMARY OF THE INVENTION

The present invention provides a thin film transistor ("TFT") having a self-aligned offset region and a method of fabricating the same.

The present invention also provides a high-quality thin film transistor ("TFT") having a good lightly doped drain ("LDD") and a drain junction through effective heat treatment and a method of fabricating the same.

According to an exemplary embodiment of the present invention, a thin film transistor is provided, the thin film transistor includes: a substrate; a silicon layer disposed on the substrate and including a channel region, a source region and a drain region at both sides of the channel region, and offset regions, each offset region disposed between the channel region and one of the source and drain regions at both sides of the channel region; a gate insulating layer covering the channel region and the offset regions disposed at both sides of the channel region excluding the source and drain regions; and a gate layer formed on the channel region excluding the offset regions.

A dopant with a lower concentration than in the source and drain regions may be implanted into the offset regions.

According to another exemplary embodiment of the present invention, a method of fabricating a thin film transistor is provided, the method includes: preparing a substrate on which a silicon layer is disposed; forming a gate insulating layer on the silicon layer; forming a gate layer on the gate insulating layer; patterning the gate layer and the gate insulating layer in the same pattern; reducing a longitudinal width of the gate layer to expose a predetermined width of both sides of the gate insulating layer; implanting a dopant into the exposed portion of silicon not covered by the gate insulating layer; and annealing the exposed portion of the dopant-implanted silicon layer by irradiating a laser on the silicon layer.

The patterning of the gate layer and the gate insulating layer may include: forming a gate patterning mask layer using a photoresist on the gate layer; and patterning the exposed portion of the gate layer not covered by the gate patterning mask layer and the gate insulating layer under the gate layer.

The reducing of the longitudinal width of the gate layer may include: reducing a longitudinal width of the gate patterning mask layer to expose longitudinal both sides of the gate patterning mask layer; and etching both sides of the gate layer not covered by the mask layer to expose a predetermined width of both sides of the gate insulating layer.

The reducing of the longitudinal width of the gate patterning mask layer may be performed by ashing using plasma.

According to exemplary embodiments of the present invention, the substrate may be a wafer, plastic or glass substrate.

BRIEF DESCRIPTION OF THE DRAWINGS

The above and other aspects, features and advantages of the present invention will become more apparent by describing in more detail exemplary embodiments thereof with reference to the attached drawings in which.

DETAILED DESCRIPTION OF THE INVENTION

The present invention now will be described more fully hereinafter with reference to the accompanying drawings, in which exemplary embodiments of the present invention are shown. The present invention may, however, be embodied in many different forms and should not be construed as limited to the embodiments set forth herein. Rather, these exemplary embodiments are provided so that this disclosure will be thorough and complete, and will fully convey the scope of the present invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described with reference to the accompanying drawings.

Figure 1:
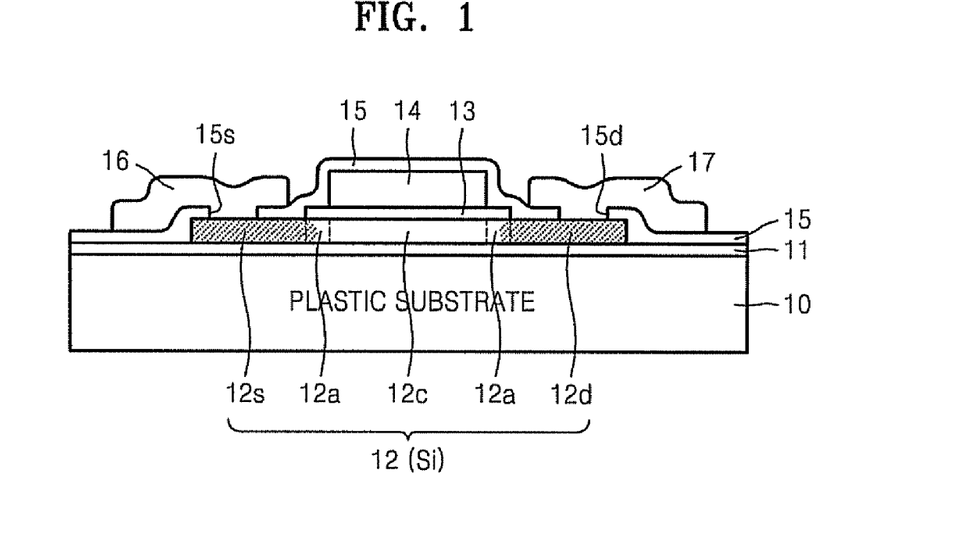
FIG. 1 is a cross-sectional view of a thin film transistor ("TFT") according to an exemplary embodiment of the present invention.

FIG. 1 is a schematic cross-sectional view of a thin film transistor ("TFT") according to an exemplary embodiment of the present invention.

A buffer layer 11 such as silicon oxide or silicon nitride is formed on a substrate 10 and a silicon layer 12 that extends in a predetermined direction (right and left as illustrated in FIG. 1) is formed on the buffer layer 11. The silicon layer 12 includes a central channel layer 12c which is a carrier control region, lightly doped regions 12a and 12a which are high resistance regions located at both sides of the channel layer 12c and a source region 12s and a drain region 12d which are low resistance regions located outside the channel layer 12c and the lightly doped regions 12a and 12a. A gate insulating layer 13 is formed on the channel layer 12c and the lightly doped regions 12a and 12a. In addition, the gate layer 14 has a small width in a longitudinal direction of the gate insulating layer 13 and is formed only on the channel layer 12c between the lightly doped regions 12a and 12a. This characteristic structure is obtained by a method of fabricating a thin film transistor ("TFT"), which will be described later. An interlayer dielectric ("ILD") layer 15 is formed on the surface of a stacked structure including the gate layer 14, the source region 12s and the drain region 12d. Contact holes 15s and 15d connected to the source region 12s and the drain region 12d are formed in the ILD layer 15. A source electrode 16 and a drain electrode 17 are formed on the contact holes 15s and 15d, respectively. A passivation layer (not shown) is formed on the uppermost portion of the stacked structure.

In the thin film transistor ("TFT"), a portion of dopant implanted into each of the source region 12s and the drain region 12d is diffused in a lower portion of the gate insulating layer 13 during heat treatment so that the lightly doped regions 12a and 12a are obtained. The lightly doped regions 12a and 12a appear during heat treatment when heated at a temperature above a melting point and dopant diffusion slightly occurs below the melting point.

Figure 2:
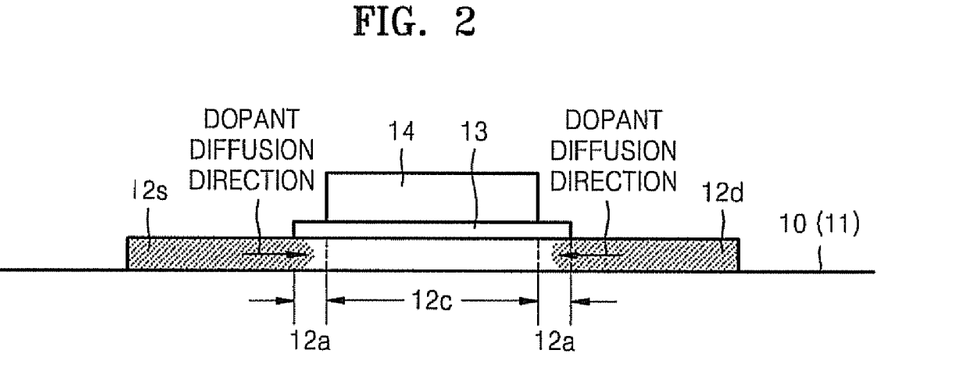
FIG. 2 is a partial enlarged view of a portion of the thin film transistor ("TFT") illustrated in FIG. 1.

The above described stacked structure is characterized in that a source junction and a drain junction offset from the gate layer 14 are located near both lower end portions of the gate insulating layer 13 below the gate layer 14, as illustrated in FIG. 2. The source region 12s and a drain region 12d are crystallographically stabilized by heat treatment or annealing so as to compensate for damage caused by doping and a portion of dopant doped in the source region 12s and the drain region 12d is diffused in the gate insulating layer 13 so that the lightly-doped region 12a and 12a can be naturally obtained. An extension of the gate insulating layer 13 that is not covered by the gate layer 14 acts as a mask during doping and doping is not injected into a portion positioned directly below the gate layer 14. Because of the extension of the gate insulating layer 13, a passage of a laser during heat treatment is allowed and silicon below the gate insulating layer 13 is thermally treated and is conducive to dopant diffusion from the source region 12s and the drain region 12d.

In the TFT having the above structure according to the present invention, the substrate 10 may be a silicon wafer, an insulating substrate, for example, a plastic substrate or a glass substrate. The following exemplary embodiment is directed to a method of fabricating a thin film transistor by which an insulating substrate is used, (e.g., a plastic substrate).

The method of fabricating a thin film transistor according to an exemplary embodiment of the present invention will now be described with reference to FIGS. 3A-3M.

Figure 3A:
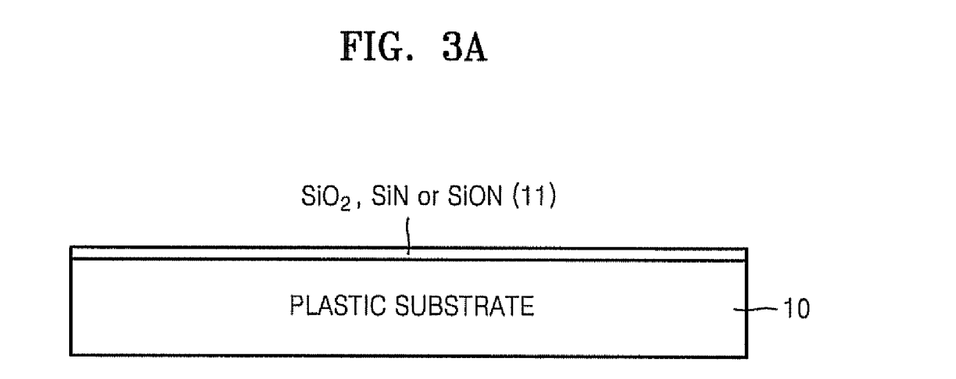
FIGS. 3A through 3M illustrate a method of fabricating a thin film transistor ("TFT") according to an exemplary embodiment of the present invention.

Referring to FIG. 3A, a substrate 10 on which a silicon layer 12 is formed is prepared. As described above, the substrate 10 is a silicon wafer, a plastic substrate or a glass substrate. A buffer layer 11 disposed below the silicon layer 12 is silicon oxide or silicon nitride. In this case, when the substrate 10 is a silicon wafer, the buffer layer 11 is obtained by surface oxidation of a silicon wafer. When the substrate 10 is a glass or plastic substrate, the buffer layer 11 is obtained by an additional process of forming a layer.

Figure 3B:
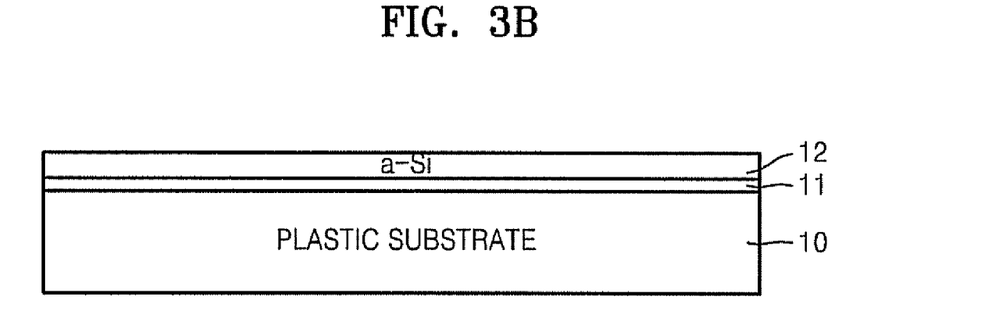

Referring to FIG. 3B, an amorphous silicon thin film ("a-Si") is formed on the buffer layer 11 of the substrate 10 to a thickness of about 50 nm. The a-Si is formed by physical vapor deposition ("PVD") including sputtering. In the case of using sputtering, a sputtering gas by which low temperature deposition is performed uses a rare gas, for example, argon (Ar). A sputtering power is 200 W and a gas pressure is set to 5 mTorr.

Figure 3C:
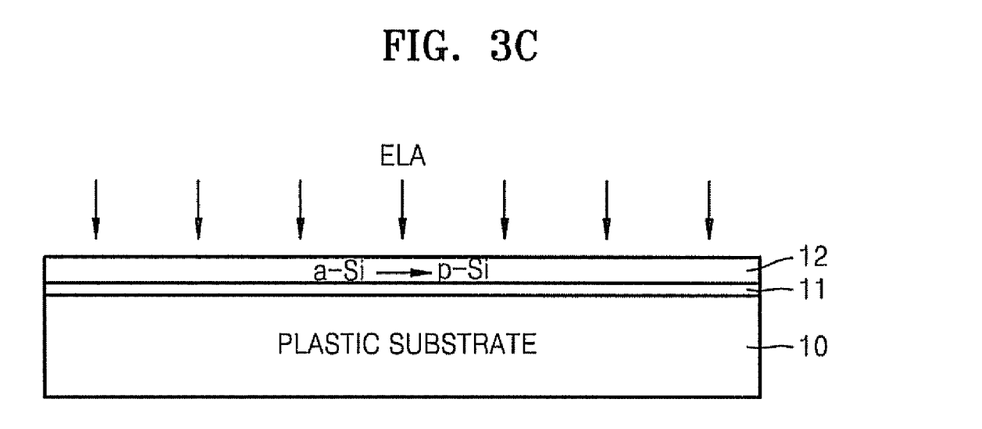

Referring to FIG. 3C, the amorphous silicon layer 12 is thermally heated by excimer laser annealing ("ELA") and is crystallized, thereby obtaining a polycrystalline silicon layer ("p-Si") 12.

Figure 3D:
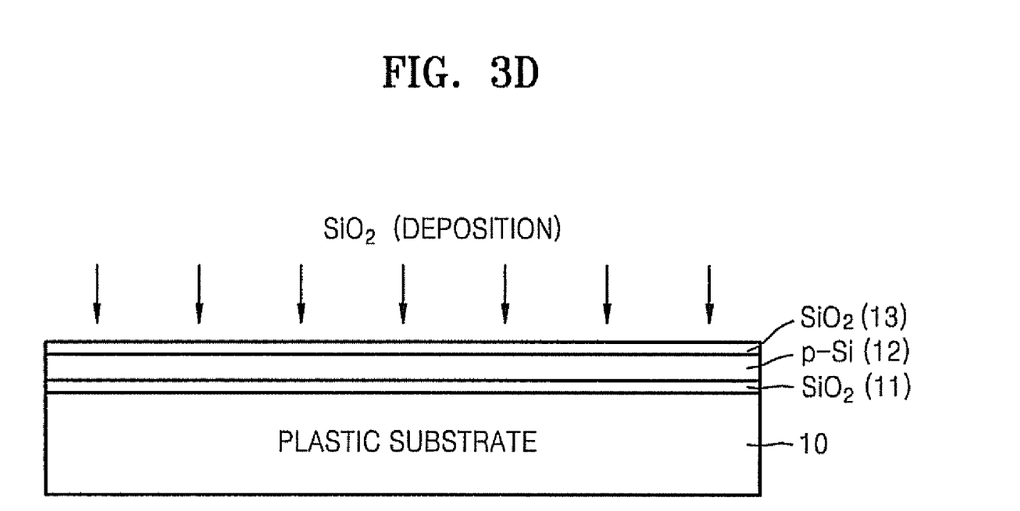

Referring to FIG. 3D, an $SiO_2$ gate insulating layer 13 is formed on the silicon layer 12. $SiO_2$ is deposited to a thickness of about 100 nm to about 200 nm using inductively coupled plasma ("ICP") chemical vapor deposition ("CVD"), plasma enhanced ("PECVD") or sputtering, thereby obtaining the $SiO_2$ gate insulating layer 13 having a desired thickness.

Figure 3E:
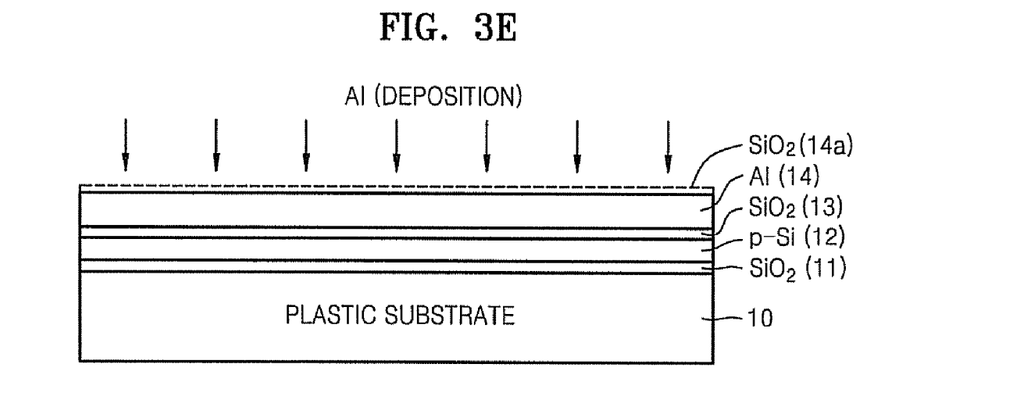

Referring to FIG. 3E, metal such as aluminium (Al) is deposited on the gate insulating layer 13 so that a gate layer 14 is formed to a thickness of about 100 nm. Here, the gate insulating layer 13 and the gate layer 14 have shapes for performing a predetermined function and are patterned in a desired final shape using subsequent processes. Meanwhile, according to an exemplary embodiment, a protective layer 14a, such as $SiO_2$, for example, for protecting the gate layer 14 may be formed on the entire surface of the gate layer 14.

Figure 3F:
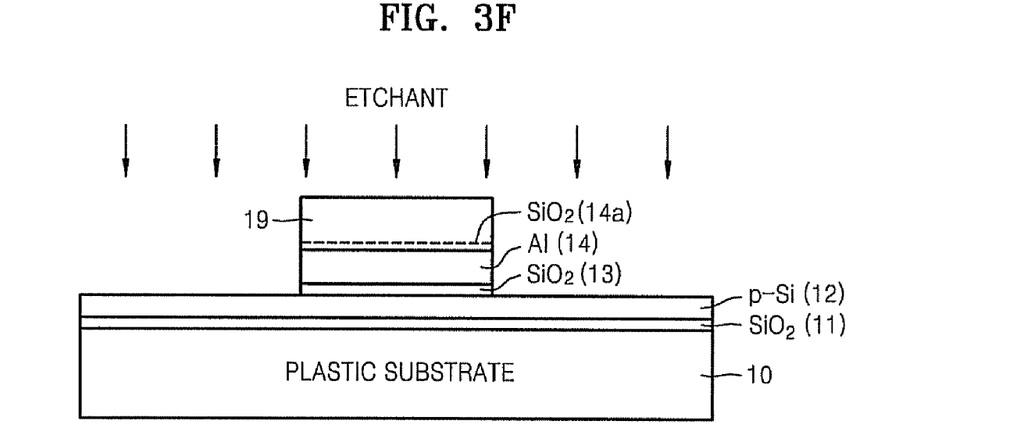

Referring to FIG. 3F, after a gate patterning mask 19 is formed on the gate layer 14 or the protective layer 14a for protecting the gate layer 14 using a photoresist, the gate layer 14 and the gate insulating layer 13 are then patterned using anisotropic dry etching such as reactive ion etching ("RIE"). The gate patterning mask 19 has a pattern corresponding to the shape of the gate insulating layer 13 and the gate layer 14 is patterned again in a subsequent process. The gate layer 14 is temporarily patterned by patterning and the gate insulating layer 13 under the gate layer 14 is also finally patterned in the same shape. Thus, the silicon layer 12 is exposed by a portion that is not covered by the gate layer 14. A description of the protective layer 14a will be omitted.

Figure 3G:
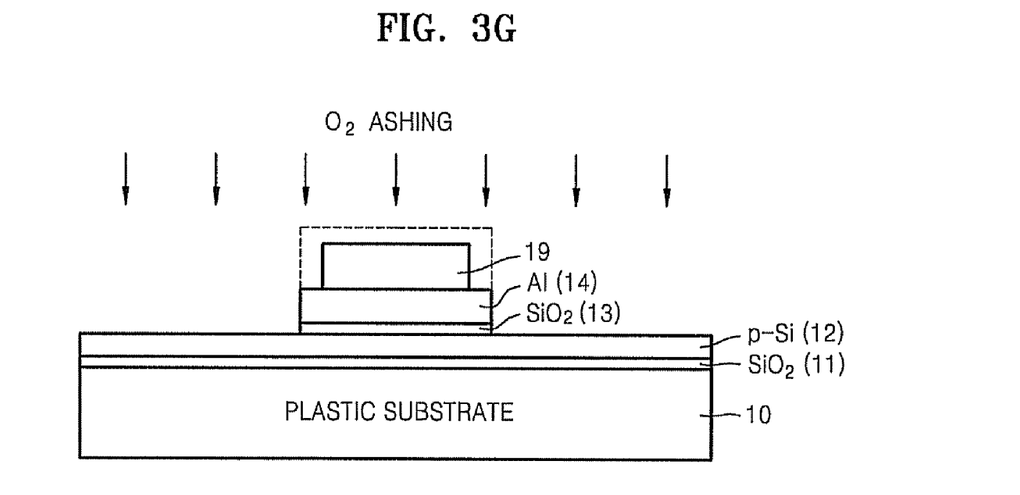

Referring to FIG. 3G, a width of the gate patterning mask 19 is reduced through ashing using oxygen plasma. Oxygen of about 50 ccm is supplied in the ashing process. In this case, a power is 150 Watts and a pressure is set to about 150 mtorr. The width of the gate patterning mask 19 is reduced to about 50 nm to about 100 nm in a longitudinal direction in which a source region, a channel region and a drain region are arranged. Thus, a portion of both sides of the gate insulating layer 13 under the gate patterning mask 19 are exposed. The exposed portion corresponds to a lightly doped region in the silicon layer 13.

Figure 3H:
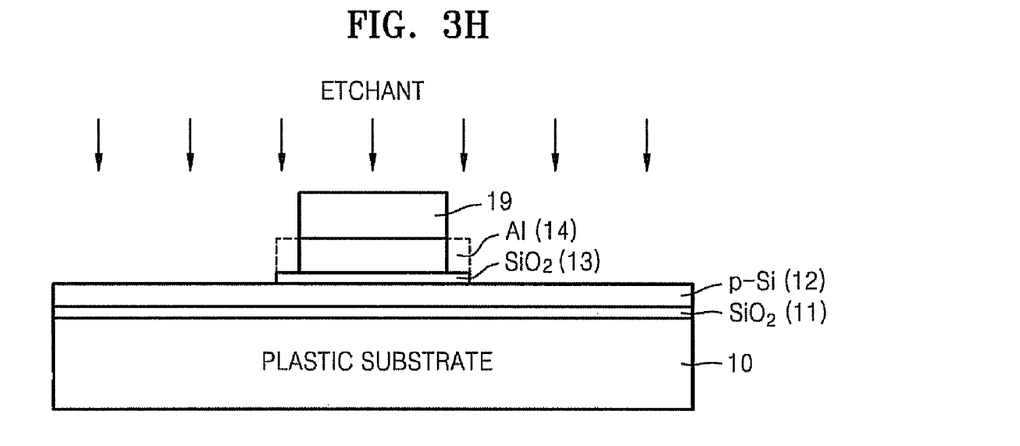

Referring to FIG. 3H, the exposed portion of the gate layer 14 that is not covered by the gate patterning mask 19 is removed so that the gate layer 14 is finally patterned.

Figure 3I:
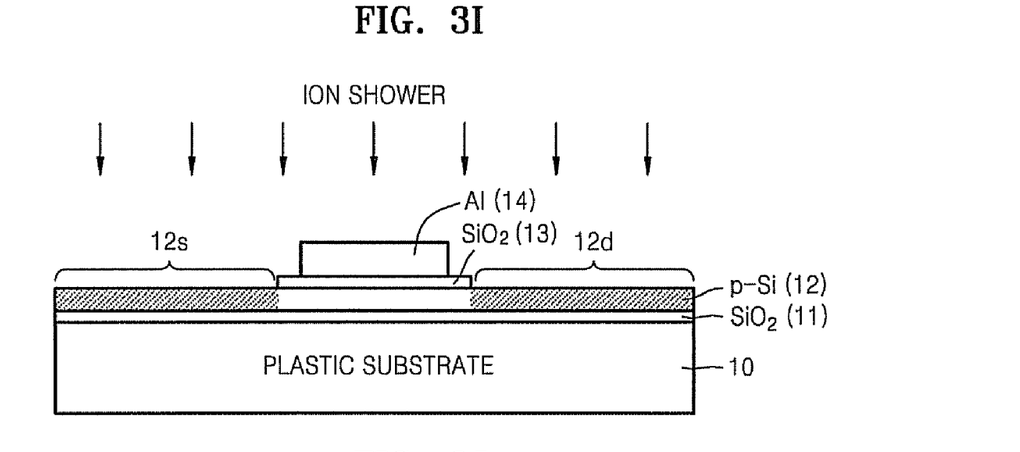

Referring to FIG. 3I, after the gate patterning mask 19 is stripped, a dopant is injected into a portion corresponding to the exposed portion of the silicon layer 13, that is, a source region 12s and a drain region 12d, using an ion shower. In this case, the dopant concentration is $10^{15}$ Atoms/cm$^2$.

Figure 3J:
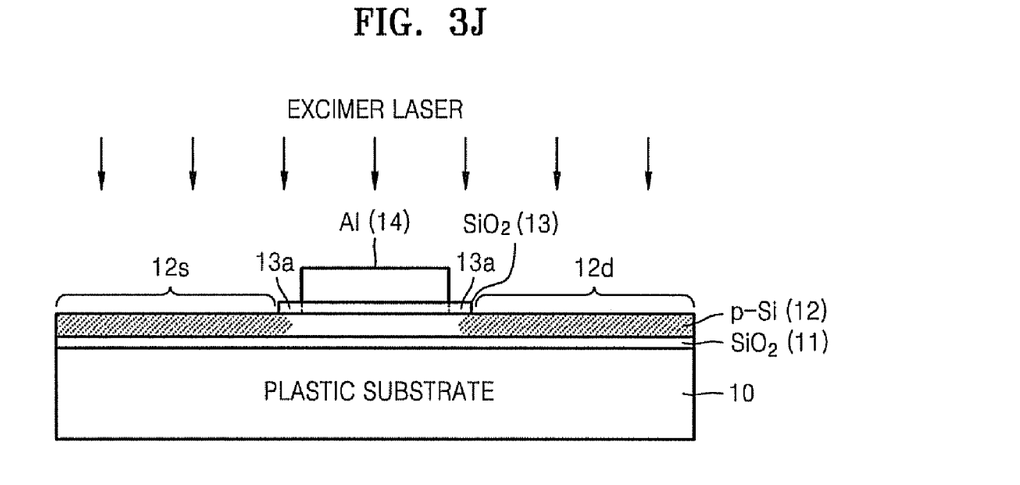

Referring to FIG. 3J, an excimer laser is irradiated from the stacked structure so that the source region 12s and the drain region 12d into which the dopant is injected are annealed and activated. In this case, the excimer laser is an XeCl excimer laser having a wavelength of 308 nm and calorie is between about 200 mJ/cm$^2$ and about 700 mJ/cm$^2$. According to the activation process using heat treatment, the dopant injected into the source region and the drain region is diffused in a lower portion of an extension of the gate insulating layer 13 so that a lightly doped region of high resistivity is formed in the lower portion of the extension of the gate insulating layer 13 (see FIG. 2), as described above. In this case, the excimer laser transmits extensions 13a and 13a of the gate insulating layer 13 that are not covered by the gate layer 14, heats a dopant-undoped portion, that is, lightly doped regions 12a and 12a, so as to facilitate diffusion of the dopant.

Figure 3K:
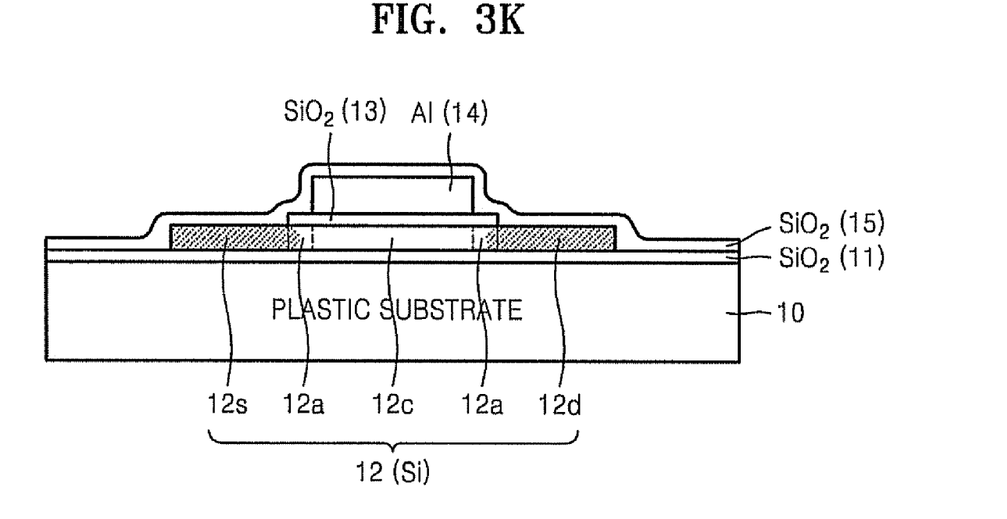

Referring to FIG. 3K, a $SiO_2$ ILD layer 15 is formed to a thickness of about 3,000 nm on the stacked structure using ICP CVD, PECVD or sputtering.

Figure 3L:
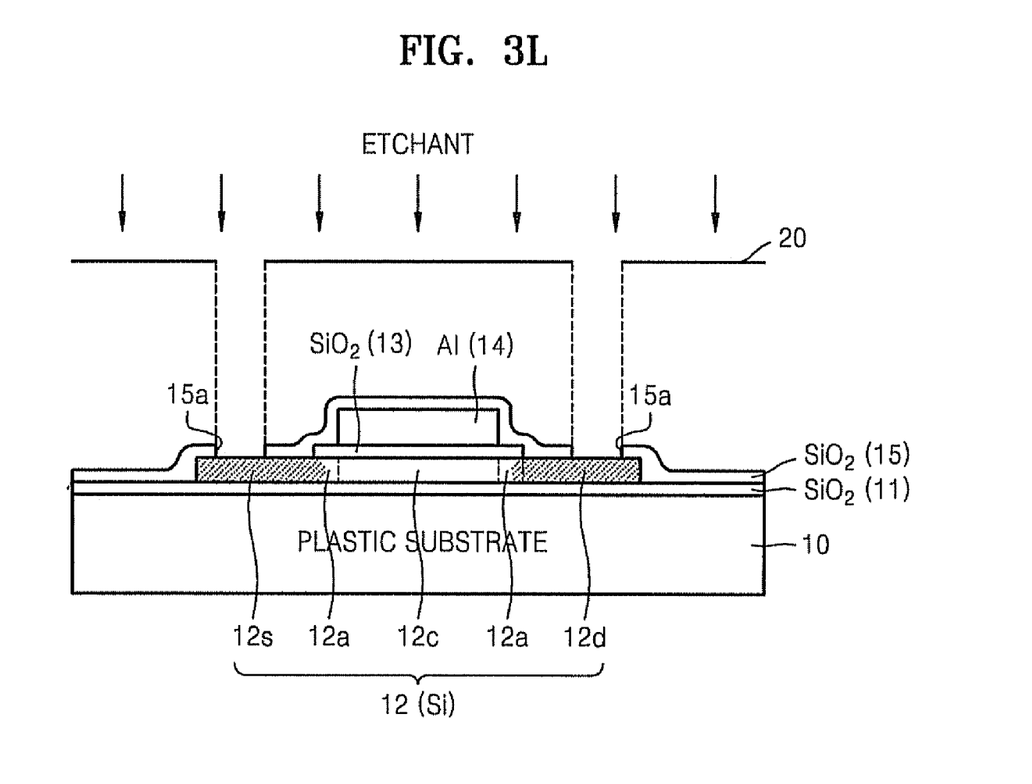

Referring to FIG. 3L, a source contact hole 15s and a drain contact hole 15d are formed on the ILD layer 15 using a contact hole patterning mask 20.

Figure 3M:
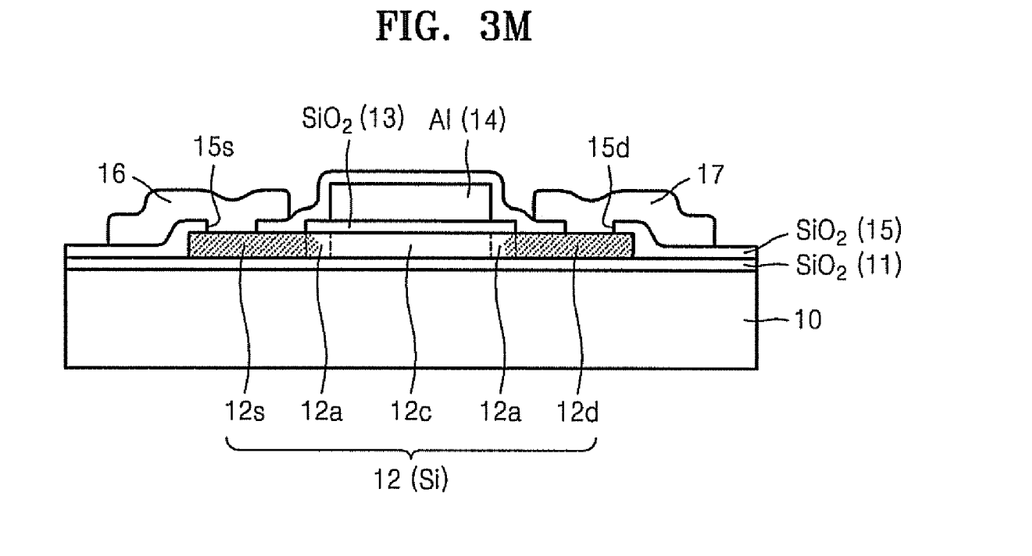

Referring to FIG. 3M, a source electrode 16 and a drain electrode 17 are formed on the source contact hole 15s and the drain contact hole 15d, respectively, thereby obtaining a desired TFT.

According to the present invention, a lightly doped drain ("LDD") having a self-aligned offset structure can be obtained from the gate layer. In particular, the lightly doped drain ("LDD") is obtained by natural diffusion of a source-drain dopant without additional doping. Thus, the LDD can be controlled by performing etching twice using a gate patterning mask and can be obtained by inducing diffusion without an additional process of obtaining the LDD having an offset structure.

As described above, the photoresist mask 19 is formed on the gate layer 14. However, after a metallic gate layer 14 is formed before the photoresist mask 19 is formed, a protective layer 14a may be formed for protecting the metallic gate layer 14, for example, an $SiO_2$ protective layer 14a. The $SiO_2$ protective layer 14a prevents physical deformation of the gate layer 14 in a laser annealing process for activating the source region 12s and the drain region 12d.

Figure 4:
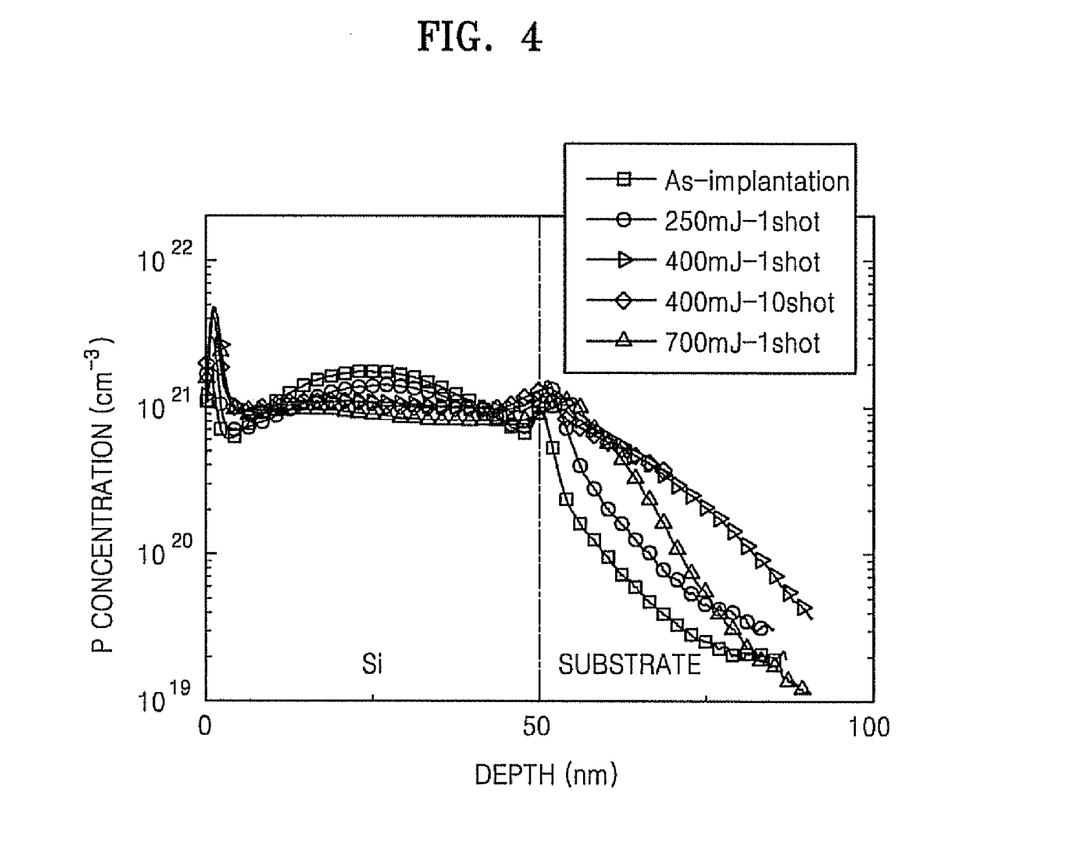
FIG. 4 is a graph showing diffusion of a dopant through heat treatment.

FIG. 4 is a graph showing diffusion of a dopant P in silicon having a thickness of 50 nm on several annealing conditions. Referring to FIG. 4, the concentration of the dopant P after doping is highest in a middle depth of the substrate 10 and is gradually reduced toward a surface or a bottom surface of the substrate 10. The concentration of a portion, which is close to the surface of the substrate 10 and which the dopant P directly collides, is much higher compared to other portions. The concentration of a portion under the surface of the substrate 10 is rapidly reduced and then, the concentration of the middle portion of the silicon layer is highest (As-implantation). However, the concentration of the middle depth of the substrate 10 after heat treatment is low. On the other hand, a variation in the surface of silicon or on a bottom of the silicon is not large. As a higher energy is applied during heat treatment, a reduction in concentration in the middle depth of the substrate 10 is large and becomes uniform. Diffusion of the dopant P is about $10^8$ times larger in the melted state than in a solid state. This result shows that, when the doped silicon is melted, a very large amount of dopant is quickly diffused and furthermore, a degree of diffusion of the dopant P can be controlled by changing heat treatment conditions. Numbers of an example shown in FIG. 4 denote an energy amount as mJ/cm and irradiation number (shot).

In the above exemplary embodiment, a photoresist mask for patterning a gate layer is patterned twice so as to reduce a width of the gate layer compared to a width of a gate insulating layer. However, the width of the gate layer can be easily reduced compared to the width of the gate insulating layer using patterning in another well-known format. For example, after the gate layer and the gate insulating layer are patterned by primary dry etching, only the gate layer is patterned using an additional mask using secondary dry etching. That is, according to the present invention, a specific method of exposing a lower portion of both sides of the gate insulating layer under the gate layer by reducing a longitudinal width of the gate layer depends on other patterning techniques, except for the method described in the above exemplary embodiment and thus, the technical scope of the present invention is not limited.

According to the present invention, the offset structure or the LDD can be easily achieved without an additional process or an additional mask. Thus, an extension of the gate insulating layer that is not covered by the gate layer using double patterning of the gate layer is formed and the extension of the gate insulating layer prevents doping such that an offset in a source/drain junction is naturally formed. In particular, a laser transmits the extension of the gate insulating layer during heat treatment such that the dopant injected into the source/drain region is diffused in a silicon layer under the gate insulating layer and the LDD can be easily obtained. In addition, the length of the offset structure or the LDD can be easily controlled in a self alignment manner.

The present invention is suitable for a method of fabricating a transistor, in particular, a method of fabricating a thin film transistor ("TFT") that requires a low off or leakage current. Furthermore, the present invention can be applied to a flat display, for example, AMLCD or AMOLED using a material that is not resistant to heat, such as plastic or glass, in a substrate.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a thin film transistor, the method comprising:
    preparing a substrate on which a silicon layer is disposed;
    forming a gate insulating layer on the silicon layer;
    forming a gate layer on the gate insulating layer;
    patterning the gate layer and the gate insulating layer in the same pattern;
    reducing a longitudinal width of the gate layer to expose a predetermined width of both sides of the gate insulating layer;
    implanting a dopant into the exposed portion of silicon that is not covered by the gate insulating layer; and
    annealing the exposed portion of the dopant-implanted silicon layer by irradiating a laser on the silicon layer.

2. The method of claim 1, wherein the patterning of the gate layer and the gate insulating layer comprises:
    forming a gate patterning mask layer using a photoresist on the gate layer; and
    patterning the exposed portion of the gate layer not covered by the gate patterning mask layer and the gate insulating layer under the gate layer.

3. The method of claim 2, wherein the reducing of the longitudinal width of the gate layer comprises:
    reducing a longitudinal width of the gate patterning mask layer to expose longitudinal both sides of the gate patterning mask layer; and
    etching both sides of the gate layer not covered by the mask layer to expose a predetermined width of both sides of the gate insulating layer.

4. The method of claim 1, wherein the reducing of the longitudinal width of the gate layer comprises:
    reducing a longitudinal width of the gate patterning mask layer to expose longitudinal both sides of the gate patterning mask layer; and
    etching both sides of the gate layer not covered by the mask layer to expose a predetermined width of both sides of the gate insulating layer.

5. The method of claim 2, wherein the reducing of the longitudinal width of the gate layer is performed by ashing using plasma.

6. The method of claim 3, wherein the reducing of the longitudinal width of the gate patterning mask layer is performed by ashing using plasma.

7. The method of claim 4, wherein the reducing of the longitudinal width of the gate patterning mask layer is performed by ashing using plasma.

* * * * *